United States Patent
Franklin et al.

(10) Patent No.: US 10,251,178 B2
(45) Date of Patent: Apr. 2, 2019

(54) QOE PROVISIONING METHOD AND APPARATUS FOR MOBILE VIDEO APPLICATION

(71) Applicant: Samsung Electronics Co., Ltd., Gyeonggi-do (KR)

(72) Inventors: Antony Franklin, Gyeonggi-do (KR); Jungshin Park, Seoul (KR); Cheolgi Lee, Seoul (KR)

(73) Assignee: Samsung Electronics Co., Ltd (KR)

( * ) Notice: Subject to any disclaimer, the term of this patent is extended or adjusted under 35 U.S.C. 154(b) by 94 days.

(21) Appl. No.: 14/689,703

(22) Filed: Apr. 17, 2015

(65) Prior Publication Data
US 2015/0304737 A1 Oct. 22, 2015

(30) Foreign Application Priority Data
Apr. 17, 2014 (KR) .................. 10-2014-0046252

(51) Int. Cl.
*H04L 1/00* (2006.01)
*H03M 13/00* (2006.01)
(Continued)

(52) U.S. Cl.
CPC ..... *H04W 72/0466* (2013.01); *H03M 13/005* (2013.01); *H03M 13/255* (2013.01);
(Continued)

(58) Field of Classification Search
CPC ...... H04H 20/28; H04H 60/33; H04N 21/812; H04N 7/17309; H04L 47/70; H04L 47/72;
(Continued)

(56) References Cited

U.S. PATENT DOCUMENTS

| 8,331,229 B1* | 12/2012 | Hu ........................ H04L 47/805 370/230 |
| 2010/0248643 A1* | 9/2010 | Aaron .................. H04L 1/0002 455/68 |

(Continued)

FOREIGN PATENT DOCUMENTS

TW  201206113  2/2012

OTHER PUBLICATIONS

S. Barakovic et al., "Survey and Challenges of QoE Management Issues in Wireless Networks", Journal of Computer Networks and Communications, Article ID 165146, 2013, 29 pages.
(Continued)

*Primary Examiner* — Robert J Hance
*Assistant Examiner* — Anthony Bantamoi
(74) *Attorney, Agent, or Firm* — The Farrell Law Firm, P.C.

(57) ABSTRACT

Disclosed are a network-based quality of experience (QoE) provisioning method and apparatus for mobile video applications. A QoE provisioning method of a policy and charging rules function (PCRF) in a network includes collecting, by the PCRF, information for QoE estimation of a data flow from a user equipment measurement apparatus and a network measurement apparatus in the network, transmitting, by the PCRF, a request for the QoE estimation for the data flow, to a QoE estimation unit in the network, the data flow including information used for the QoE estimation, and transmitting, by the PCRF, a request for QoE adjustment to a server that transmits the data flow, based on the QoE estimated by the QoE estimation unit and the QoE required for the data flow.

26 Claims, 15 Drawing Sheets

(51) Int. Cl.
| | |
|---|---|
| *H03M 13/25* | (2006.01) |
| *H04N 21/24* | (2011.01) |
| *H04W 72/04* | (2009.01) |
| *H04N 21/442* | (2011.01) |
| *H04N 21/647* | (2011.01) |
| *H04N 21/658* | (2011.01) |
| *H04N 21/2343* | (2011.01) |
| *H04N 21/4425* | (2011.01) |
| *H04N 21/6373* | (2011.01) |

(52) U.S. Cl.
CPC ... *H03M 13/6362* (2013.01); *H03M 13/6525* (2013.01); *H04L 1/0071* (2013.01); *H04N 21/2343* (2013.01); *H04N 21/2401* (2013.01); *H04N 21/2402* (2013.01); *H04N 21/2404* (2013.01); *H04N 21/4425* (2013.01); *H04N 21/44209* (2013.01); *H04N 21/44213* (2013.01); *H04N 21/44222* (2013.01); *H04N 21/6373* (2013.01); *H04N 21/6473* (2013.01); *H04N 21/64723* (2013.01); *H04N 21/64738* (2013.01); *H04N 21/6582* (2013.01); *H03M 13/6306* (2013.01)

(58) Field of Classification Search
CPC ......... H04L 47/74; H04L 47/78; H04L 47/80; H04L 47/351; H04L 47/36; H04L 47/365; H04L 47/38; H04L 47/6215; H04L 47/628; H04L 5/0064; H04L 65/4092; H04L 2012/5636; H04L 43/0894; H04L 47/25; H04L 47/263; H04W 4/24; H04W 12/08; G06Q 30/02
See application file for complete search history.

(56) References Cited

U.S. PATENT DOCUMENTS

| | | | |
|---|---|---|---|
| 2011/0069685 A1* | 3/2011 | Tofighbakhsh | H04L 41/5067 370/338 |
| 2011/0211464 A1* | 9/2011 | Chetlur | H04L 41/5067 370/252 |
| 2012/0192216 A1 | 7/2012 | Chen et al. | |
| 2012/0216099 A1 | 8/2012 | Jeong et al. | |
| 2013/0021933 A1 | 1/2013 | Kovvali et al. | |
| 2013/0031575 A1 | 1/2013 | Gallant et al. | |
| 2014/0064072 A1* | 3/2014 | Ludwig | H04L 47/2483 370/230 |
| 2016/0050124 A1* | 2/2016 | Sanchez Vega | H04L 41/5025 725/85 |

OTHER PUBLICATIONS

Gerardo Gomez et al., "Towards a QoE-Driven Resource Control in LTE and LTE-A Networks", Journal of Computer Networks and Communications, Article ID 505910, 2013, 16 pages.
3rd Generation Partnership Project; Technical Specification Group Services and System Aspects; Policy and Charging Control Architecture (Release 10), 3GPP TS 23.203 V10.6.0, Mar. 2012, 130 pages.
International Search Report dated Jul. 24, 2015 issued in counterpart application No. PCT/KR2015/003844, 4 pages.
Chinese Office Action dated Jan. 3, 2019 issued in counterpart application No. 201580019877.8, 21 pages.

* cited by examiner

QOE PROVISIONING METHOD AND APPARATUS FOR MOBILE VIDEO APPLICATION

PRIORITY

This application claims priority under 35 U.S.C. § 119(a) to Korean Patent Application No. 10-2014-0046252, filed on Apr. 17, 2014, the contents of which are incorporated herein by reference.

BACKGROUND OF THE INVENTION

1. Field of the Invention

The present invention relates to a network-based quality of experience (QoE) provisioning method for mobile video applications and an apparatus thereof.

2. Description of the Related Art

A QoE provisioning mechanism in the application level is recently being developed, in which a client application reports QoE-related information to an application server which adjusts media information, such as the quality of video, through a codec or rate adaptation.

A typical video transmission mechanism for supporting the dynamic video quality adjustment through application level signalling uses the following two methods.

The first is video streaming based on the real-time transport protocol/real-time streaming protocol (RTP/RTSP), which uses scalable video coding, such as video streaming-based H.294 and Dynamic Adaptive Streaming over hypertext transport protocol (HTTP) (DASH), and the second is HTTP-based video streaming for downloading small portions of a video with a specific video quality depending on the network status.

In RTP/RTSP-based video streaming, a video is transmitted together with a header including specific information for identifying the content of packets, after the video is coded. A base layer of the video is required for the basic quality in reproducing the video, and an enhancement layer of the video improves the video quality. If the enhancement layer is lost, the video quality may be affected, but the video can be continuously reproduced. If the base layer is lost, the video cannot be continuously reproduced.

In HTTP-based video streaming, the video is split into small portions with different qualities to be stored in the server. A client requests a portion of a specific video quality through an HTTP message, depending on the network congestion status. Accordingly, the video quality is dynamically adapted according to the current network congestion status.

FIG. 1 illustrates an application level QoE provisioning mechanism through an application function (AF), according to the prior art.

The AF, referred to as an application function, an application server, or a server in various embodiments of the present invention, is defined in the 3$^{rd}$ Generation Partnership Project (3GPP) for communication with an application server. If the application server can obtain more detailed information on the measured QoE, the application server requests an enhanced quality of service (QoS) for improving the QoE. Since this mechanism does not consider the current network status, an operator cannot sufficiently control through QoE provisioning.

The QoE of a video application relates to more factors than rate adaptation, such as application servers and a user's personal profiles. Therefore, a method for effectively improving the QoE using various factors as well as the network status is required.

In a video application through the Internet, while the QoE may be processed by the application, a service provider cannot control the traffic generated by a end user. However, in a mobile video application, the traffic can be controlled by network operators, such as QoE provisioning, flow-based charging, and application specific traffic treatment.

It is widely predicted that the video application will be a dominant future service in terms of the amount of consumed mobile data, rendering the video application process by the network in consideration of the QoE an important future consideration. Accordingly, there is a need in the art for a method by which an operator performs QoE provisioning for a video QoE provider and controls the network traffic.

SUMMARY OF THE INVENTION

The present invention has been made to address the above mentioned problems and disadvantages, and to provide at least the advantages described below.

Accordingly, an aspect of the present invention provides a network-based QoE provisioning method for mobile video applications.

Another aspect of the present invention provides an apparatus for performing network-based QoE provisioning for mobile video applications.

In accordance with an aspect of the present invention, a QoE provisioning method of a policy and charging rules function (PCRF) in a network includes collecting, by the PCRF, information for QoE estimation of a data flow from a UE measurement apparatus and a network measurement apparatus in the network, transmitting, by the PCRF, a request for the QoE estimation for the data flow, to a QoE estimation unit in the network, the data flow including information used for the QoE estimation, and transmitting, by the PCRF, a request for QoE adjustment to a server that transmits the data flow, based on the QoE estimated by the QoE estimation unit and the QoE required for the data flow.

In accordance with another aspect of the present invention, a QoE provisioning method of a UE measurement apparatus in a network includes receiving a request for at least one parameter related to a status of the UE necessary for QoE estimation from a PCRF, collecting, if the at least one parameter is measurable, the at least one parameter, and transmitting the collected parameter to the PCRF.

In accordance with another aspect of the present invention, a QoE provisioning method of a network measurement apparatus in a network includes receiving a request for at least one parameter related to a network status necessary for QoE estimation from a PRCF, collecting, if the at least one parameter is measurable, the at least one parameter, and transmitting the collected parameter to the PCRF.

In accordance with another aspect of the present invention, a PCRF for performing QoE provisioning in a network includes a communication unit that performs data communication and a controller that controls collecting information for QoE estimation of a data flow from a UE measurement apparatus and a network measurement apparatus in the network, transmitting a request for the QoE estimation for the data flow to a QoE estimation unit in the network, the data flow including information used for the QoE estimation, and transmitting a request for QoE adjustment to a server that transmits the data flow, based on the QoE estimated by the QoE estimation unit and a QoE required for the data flow.

In accordance with another aspect of the present invention, a UE measurement apparatus for performing QoE provisioning in a network includes a communication unit that performs data communication, and a controller that controls receiving a request for at least one parameter related to a UE status necessary for QoE estimation from a PCRF, collecting, if the at least one parameter is measurable, the at least one parameter, and transmitting the collected parameter to the PCRF.

In accordance with another aspect of the present invention, a network measurement apparatus for performing QoE provisioning in a network includes a communication unit that performs data communication, and a controller that controls receiving a request for at least one parameter related to a network status necessary for QoE estimation from a policy and charging rules function (PCRF), collecting, if the at least one parameter is measurable, the at least one parameter, and transmitting the collected parameter to the PCRF.

BRIEF DESCRIPTION OF THE DRAWINGS

The above and other aspects, features and advantages of the present invention will be more apparent from the following detailed description in conjunction with the accompanying drawings, in which.

DETAILED DESCRIPTION OF EMBODIMENTS OF THE INVENTION

Hereinafter, embodiments of the present invention will be described in detail with reference to the accompanying drawings. In the following description, a detailed description of known functions or configurations incorporated herein will be omitted for the sake of clarity and conciseness.

The terms which will be described below are defined in consideration of the functions and contents disclosed herein, and may be different according to users, intentions of the users, or customs.

Figure 1:
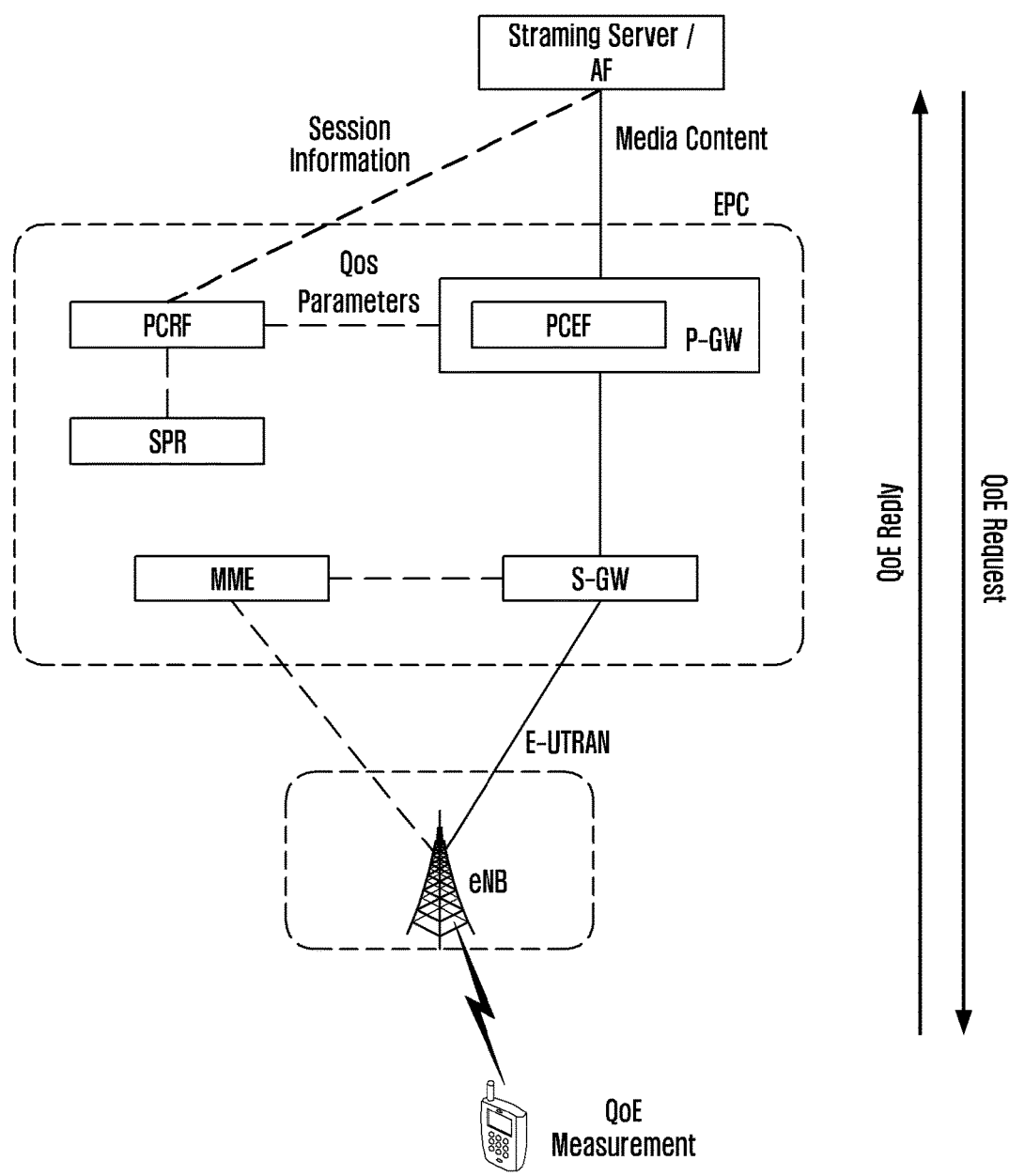
FIG. 1 illustrates an application level QoE provisioning mechanism through an AF according to the prior art.
Figure 2:
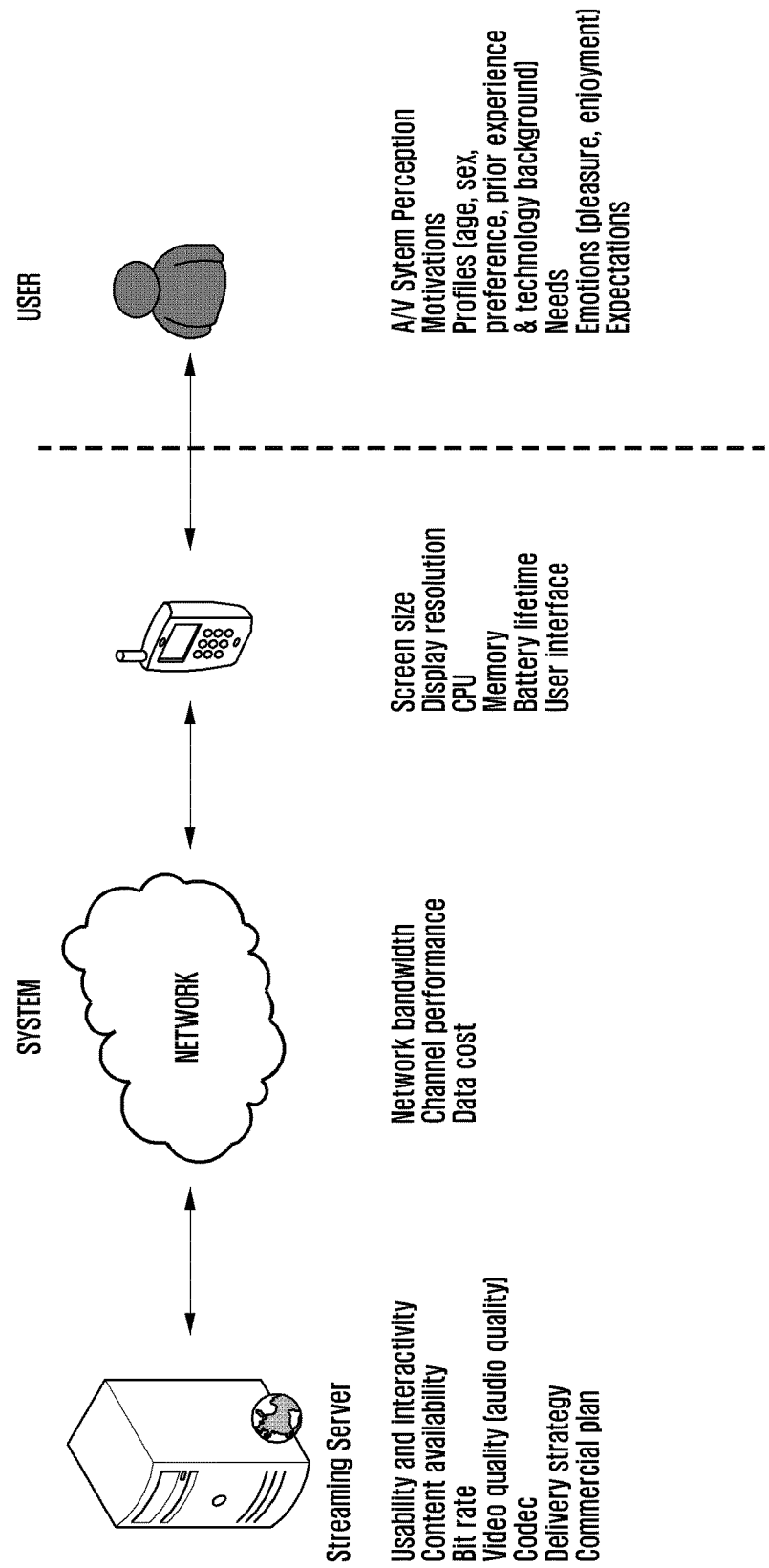
FIG. 2 illustrates factors necessary for QoE estimation to which the present invention is applied.

FIG. 2 illustrates factors necessary for QoE estimation, to which the present invention is applied.

QoE provisioning relies on various factors, such as application servers and users' personal profiles. FIG. 2 illustrates various factors that are considered for estimating user QoE in terms of media service.

The QoE is estimated server-wise using factors such as usability and interactivity, content availability, bit rate, video quality (audio quality), a codec, a delivery strategy, and a commercial plan.

The QoE is estimated network-wise using factors such as network bandwidth, channel performance, and data cost.

The QoE is estimated user equipment-wise using factors such as screen size, display resolution, a central processing unit (CPU), a memory, battery life-span, and a user interface.

The QoE is estimated user-wise using factors such as audio/video (A/V) system perception, motivations, profiles (age, sex, preference, prior experience, and technical background), needs, and emotions (pleasure, enjoyment, expectations).

Once the QoE is estimated using the factors shown in FIG. 2, the required QoE can be attained through traffic engineering in the network. As such, QoE estimation is an important element for QoE provisioning.

The present invention provides a method for collecting QoE metrics related to the factors set forth above, based on the PCRF, estimating the QoE using the collected QoE metrics, and performing QoE provisioning using the estimated QoE.

Figure 3:
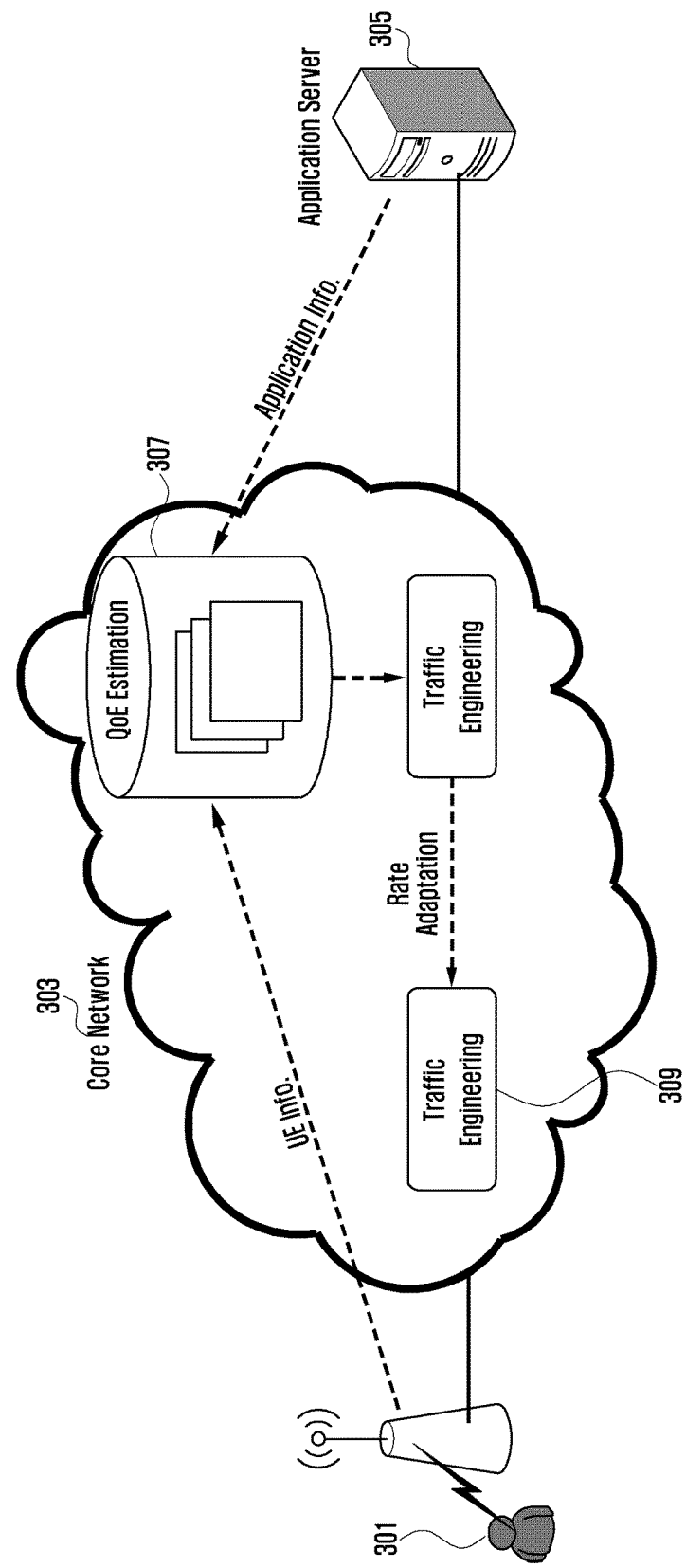
FIG. 3 illustrates a network structure to which QoE provisioning according to the present invention is applied.

FIG. 3 illustrates a network structure to which QoE provisioning according to the present invention is applied.

Such a network performs QoE estimation 307 for providing the QoE, based on various factors that can be used in a UE 301, a core network 303, and an application server (or an AF) 305. To this end, the network according to the present invention adopts a variety of entities for QoE estimation 307.

Afterwards, the network attains the required QoE through traffic engineering 309 in the network.

The present invention provides a method for obtaining various QoE factors, estimating the QoE using the obtained QoE factors, and controlling the traffic according to the QoE.

Figure 4:
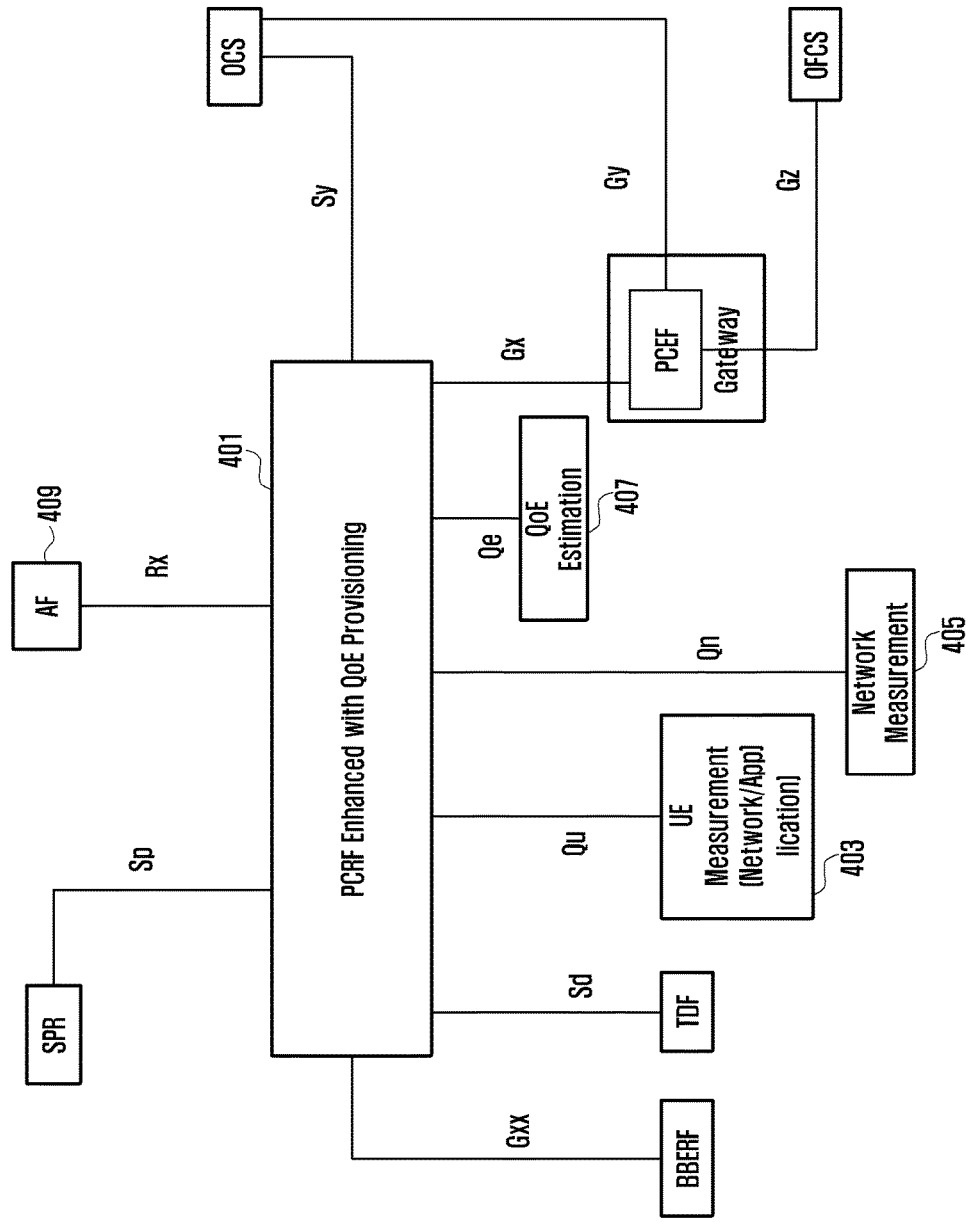
FIG. 4 illustrates a policy & charging control (PCC) structure for QoE provisioning according to the present invention.

FIG. 4 illustrates a policy & charging control (PCC) structure for QoE provisioning according to the present invention.

QoE estimation is a part of QoE provisioning in the network level. According to the present invention, the network provides a mechanism for effectively measuring various factors necessary for QoE estimation, based on traffic flow, and performs traffic flow engineering according to the video type flow. In the 3GPP network structure, the PCRF creates a policy and a rule for processing the QoE.

In the present invention, the PCRF 401 performs a process for a specific video flow through the structure shown in FIG. 4.

The PCRF 401 creates a flow-based policy, a flow-based charge, or application specific traffic management for QoE provisioning, and configures a core area of the PCC structure. In the present invention, in order to perform the flow-based QoE provisioning, new logical entities, such as an UE measurement unit 403, a network measurement unit 405, and a QoE estimation unit 407, are added to the PCC structure. The PCRF 401 performs QoE provisioning through communication with the entities.

The UE measurement unit 403 collects QoE-related metrics from the UE, and reports the same to the PCRF 401. The UE measurement unit 403 collects the metrics resulting from both application level QoE estimation and network level QoE estimation. The network measurement unit 405 measures the network-related metrics, such as QoS parameters (network level QoS measurement), and reports the same to the PCRF 401.

The PCRF 401 provides a necessary measurement report to the QoE estimation unit 407, based on the reported metrics, and instructs the QoE estimation unit 407 to estimate the current QoE. The QoE estimation unit 407 estimates the QoE using the received metrics, and reports the same to the PCRF 401. The PCRF 401 provides a policy by which QoE adjustment is processed in a flow level/trigger packet process mechanism, in order to process the estimated QoE.

In the present invention, interfaces between the entities are defined for exchanging data between the new entities added into the PCC structure and the AF 409. For example, the interface between the PCRF 401 and the UE measurement unit 403 is defined as a Qu interface, the interface between the PCRF 401 and the network measurement unit 405 is defined as a Qn interface, the interface between the PCRF 401 and the QoE estimation unit 405 is defined as a Qe interface, and the interface between the PCRF 401 and the AF 409 is defined as an Rx interface.

Consequently, the typical PCRF 401 that has managed the QoE in the prior art is improved to perform QoE provisioning in the present invention. The PCRF 401 forwards the factors reported from the UE measurement unit 403 and the network measurement unit 405 to the QoE estimation unit 407 to allow the QoE estimation unit 407 to estimate the QoE, and receives the estimated QoE from the QoE estimation unit 407. The PCRF 401 controls the network flow and traffic through signalling with the AF 409, based on the QoE.

Figure 5:
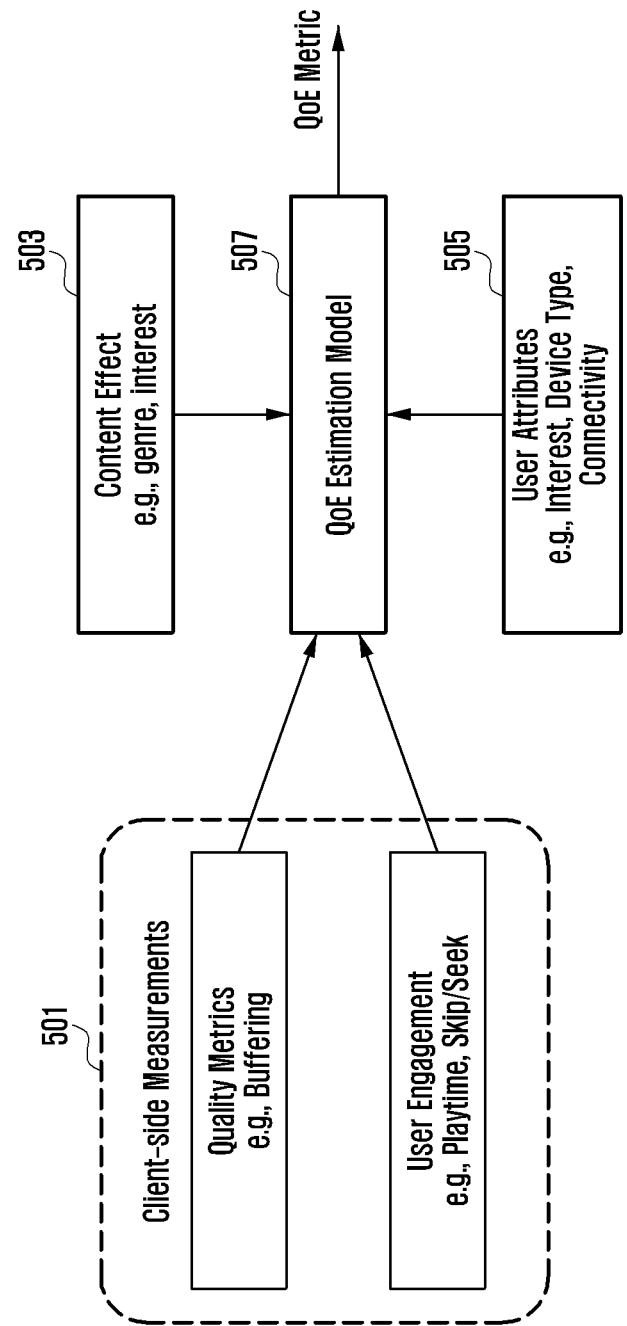
FIG. 5 illustrates a QoE estimation structure according to the present invention.

FIG. 5 illustrates a QoE estimation structure for collecting QoE metrics according to the present invention.

Referring to FIG. 5, the QoE estimation according to the present invention is performed by collecting factors related to client-side measurement 501, the content effect 503, and user attributes 505, and determining QoE metrics through a QoE estimation model 507.

The client-side measurement 501 includes quality metrics (e.g., buffering), and a user engagement (e.g., playing time and skip/search). The content effect 503 includes, for example, genre and interest. The user attributes 505 include, for example, interest, the type of device, and connectivity.

In various embodiments of the present invention, the QoE estimation structure uses an estimation model, such as machine learning, in order to estimate user QoE using various intricate correlation factors.

If some users are averse to the video quality of a specific genre, such as sports, the QoE may be adjusted for the user so that the user experience is enhanced according to the video type. A user's personal concerns may be obtained from the user profile information and/or a viewing history, which are collected from the QoE estimation unit. The details (e.g., type or genre) of the video that the user has recently accessed may be collected from the AF. The video quality may be dynamically adjusted for the user according to the video type to which the user is logging on.

When some users are averse to a delay, the user may configure his or her preference as a quick viewing experience rather than high video quality. The user averseness may be obtained through the user profiles and feedback information. When such a user views a low latency video, the QoE estimation unit may configure the user experience for the user to be low, by driving a dynamic QoS by which a low delay is provided rather than a high video quality in reproducing the video in order to improve the user experience.

When some users are viewing the latest news about specific events, such as natural disasters or political situations, the continuous reproduction of the video without interference may be more important than the video quality. The QoE estimation unit may analyze the latest videos that draw a user's interest to thereby obtain the update for the current event and the popular news. If the user continues to view specific news, the continuous reproduction of the video can be realized by adjusting QoE parameters according thereto.

Figure 6:
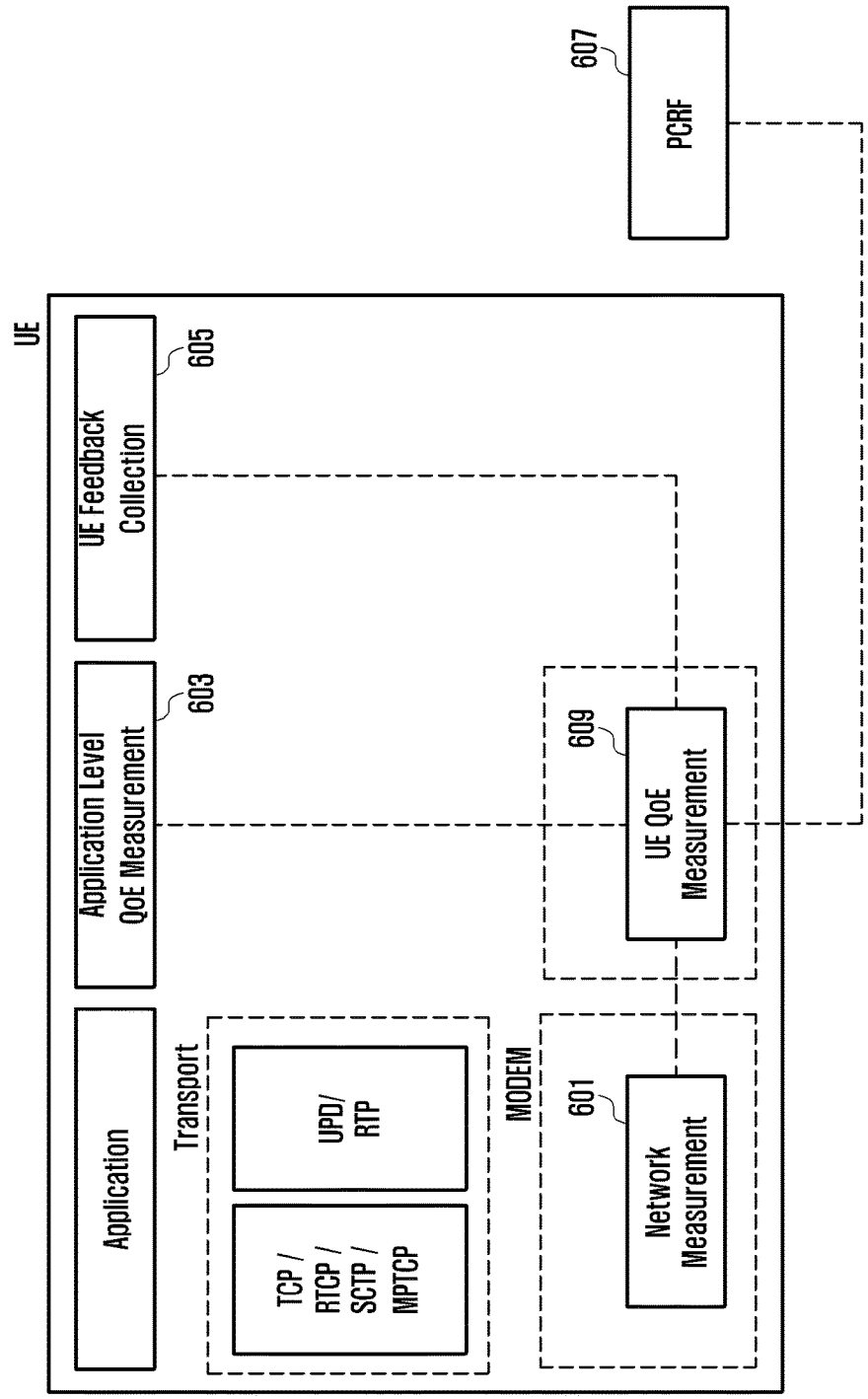
FIG. 6 illustrates a configuration of a user equipment (UE) measurement unit.

FIG. 6 illustrates a configuration of the UE measurement unit, according to the present invention.

In the following embodiments, the UE measurement unit may be the same as the UE, or may operate as an element included in the UE.

The UE provides various pieces of information for measuring the QoE. Different pieces of information may be collected at different levels. For example, user context information, such as the current time, a geographical position, a cell identifier (ID), or received signal strength indication (RSSI), and the attained QoS parameters, such as an end-to-end delay, a loss rate, or bandwidth, may be available in the network level (MODEM). The application provides other metrics, such as a buffering delay, an available buffer, and user activities (e.g., stop or search). In addition, the user may feed back information on user viewing experience, after viewing the video.

The UE includes three different modules for providing QoE-related measurement. For example, the UE includes a network measurement unit 601, an application level QoE measurement unit 603, and a UE feedback collection unit 605, as shown in FIG. 6.

The network measurement unit 601 measures the user context information, such as the current time, a geographical position, a cell ID, or RSSI, and QoS parameters, which can be collected in the network level, such as an end-to-end delay, a loss rate, or bandwidth. The network measurement unit 601 may be configured as a modem.

The application level QoE measurement unit 603 measures and collect the metrics, such as a buffering delay, an available buffer, and user activities (stop, or search). The availability of information in the application level relies on the type of UE application and user consent to provision of the information to the network.

The UE feedback collection unit 605 collects a feedback on the user viewing experience after viewing the video. The available information of the UE feedback collection unit 605 relies on the user who wishes to provide feedback on the user viewing experience to the network. Therefore, each UE may have a couple of sets of available metrics depending on the video player and the user activities. The UE negotiates with the PCRF 607 to determine which metric is to be reported and over what period the metric is to be reported. According to an embodiment of the present invention, the UE feedback collection unit 605 collects different feedback from a plurality of users.

The UE feedback collection unit 605 collects the user viewing experience about a video transmission delay from the first user, and collects feedback on the user viewing experience stating that the video quality is preferred from the second user. The UE feedback collection unit 605 may explicitly collect feedback on the video from the first user and the second user after viewing the video, or implicitly collects the user preference from the user profiles related to the UEs of the first user and the second user, or a social network application. The information collected from the network measurement unit 601, the application level QoE measurement unit 603, and the UE feedback collection unit 605 is transmitted to the UE QoE measurement unit 609.

The UE QoE measurement unit 609 forwards the collected information to the PCRF 607 to thereby use the collected information for the QoE estimation according to the present invention. When the PCRF requests a periodic report, the metrics may be reported according to a period defined by the PCRF. The UE QoE measurement unit 609 gives different weighted values to the information collected from the network measurement unit 601, the application level QoE measurement unit 603, and the UE feedback collection unit 605, based on the collected information, and summates the weighted values to thereby measure the QoE.

According to an embodiment of the present invention, the video transmission rate and the video quality may be adjusted (traded off) to maximize the QoE, based on network status information collected from the network measurement unit 601, running application information collected from the application level QoE measurement unit 603, or the user activities and the user feedback from the UE feedback collection unit 605.

Figure 7:
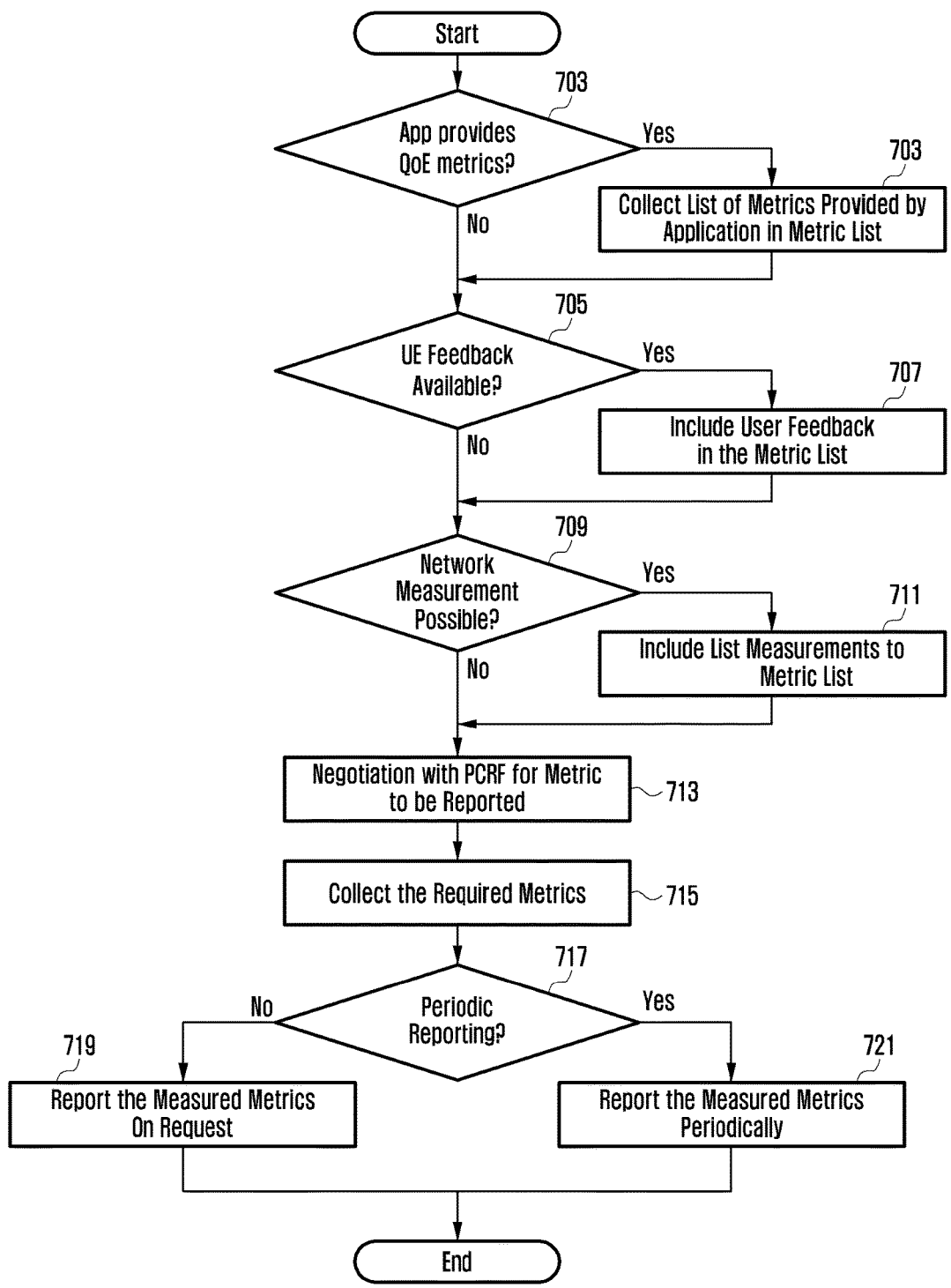
FIG. 7 is a flowchart illustrating a QoE metric reporting method of the UE measurement unit according to the present invention.

FIG. 7 is a flowchart illustrating a QoE metric reporting method of the UE measurement unit according to the present invention. Although the method of FIG. 7 may be performed by the UE or the UE measurement unit set forth above, a description will now be made of the operation of the UE.

In FIG. 7, the UE collects measurable metrics, and reports the metrics determined through the negotiation with the PCRF to the PCRF.

The UE determines whether the application provides the QoE metrics in step 701. If the application provides the QoE metrics, the UE collects a list of metrics provided by the application in a metric list in step 703. That is, the UE creates a list of metrics that can be collected on the application level. The application level metrics include a buffering delay, an available buffer, and user activities (stop, or search). If the application does not provide the QoE metrics, step 703 is omitted.

The UE determines whether the UE feedback is available in step 705. If the UE feedback is available, the UE collects a user feedback metric list in step 707. That is, the UE creates a feedback list about the user viewing experience after viewing the video. The UE feedback metrics may or may not be available according to the user selection, and more than one set of available metrics may exist according to the video player and user activities. The UE creates a list on the sets of metrics that can be used by the user. If the UE feedback is not available, step 707 is omitted.

The UE determines whether it is possible to measure the network in step 709. If it is possible to measure the network, the UE collects a network level metric list from the metric list in step 711. The UE creates a metric list including user context information, such as the current time, a geographical position, a cell ID or RSSI, an end-to-end delay, a loss rate, and bandwidth, which are collected through a modem. If the network measurement is not possible, step 709 is omitted.

Steps 701 to 711 may be simultaneously performed or may be performed in sequence. That is, the UE creates the metric list for each level in sequence, or creates the metric list simultaneously for each level or out of sequence.

The UE negotiates with the PCRF in order to determine a metric to be reported to the PCRF in step 713.

Figure 8:
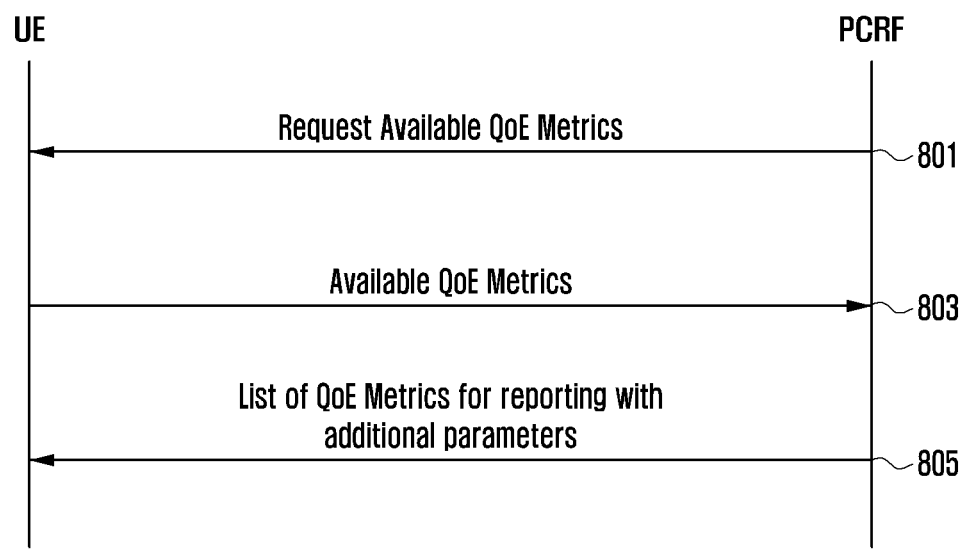
FIG. 8 is a flowchart illustrating the negotiation between the PCRF and the UE in the QoE metric reporting method of the UE measurement unit according to the present invention.

The negotiation between the UE and the PCRF is performed as shown in FIG. 8, which is a flowchart illustrating the negotiation between the PCRF and the UE in the QoE metric reporting method of the UE measurement unit according to the present invention.

In FIG. 8, the UE receives a request for available QoE metrics from the PCRF in step 801). The UE responds to the PCRF with the QoE metrics that can be used in the UE, based on the QoE metrics listed in steps 701 to 711 in step 803. The PCRF transmits a metric list that the UE is to report to the PCRF, among the received QoE metrics that can be used in the UE in step 805. The metric list that the UE should report to the PCRF is configured as the metrics that have been preliminarily approved to be provided by the UE to the PCRF through the negotiation between the UE and the PCRF. The PCRF transmits, to the UE, additional parameters together with the metric list that the UE is to report to the PCRF.

Referring back to FIG. 7, the UE collects the metrics requested by the PCRF, based on a result of the negotiation with the PCRF in step 715. The UE collects application level metrics through the application level QoE measurement unit, collects UE feedback metrics through the UE feedback collection unit, and collects network level metrics through the network measurement unit, e.g., a modem.

The UE determines whether the metrics are to be periodically reported in step 717. If the metrics do not need to be periodically reported, the UE reports the collected metrics to the PCRF and terminates the method in step 719. In various embodiments, if the PCRF has requested a periodic report, the UE reports the collected metrics periodically in a period defined by the PCRF in step 721.

Figure 9:
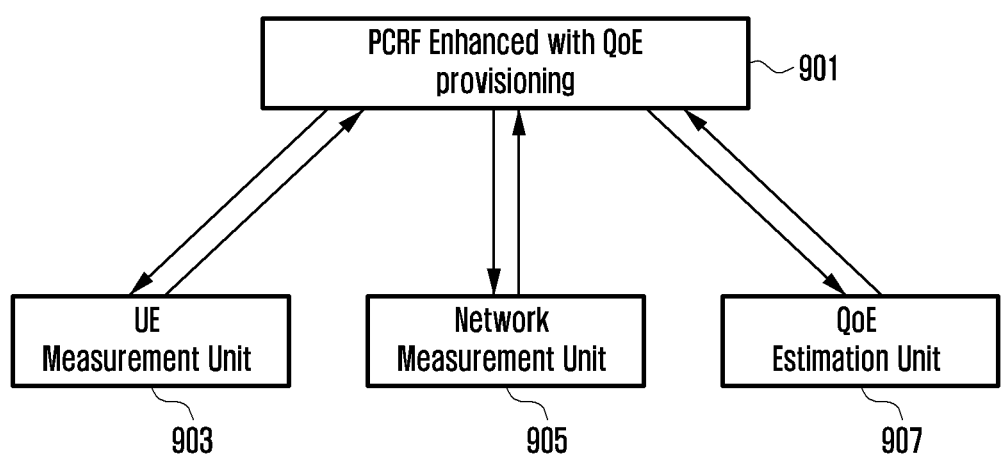
FIG. 9 illustrates a QoE information exchange mechanism according to the present invention.

FIG. 9 illustrates a QoE information exchange mechanism according to the present invention.

In QoE provisioning according to the present invention, in order for the QoE metrics to be collected from the UE measurement unit 903 and the network measurement unit 905, and for the QoE estimation unit 907 to estimate the current QoE using the QoE metrics, the QoE information should be exchanged between entities defined in the present invention. Specifically, FIG. 9 is a diagram illustrating a QoE information exchange mechanism between the entities according to the present invention.

Referring to FIG. 9, the information exchange for QoE provisioning is performed by the PCRF 901 in the present invention. In order to reduce overhead due to the message exchange, a subscriber report model between the entities may be used.

When the PCRF 901 starts QoE provisioning with respect to a data flow, the PCRF 901 provides flow information to the QoE estimation unit 907 and requests QoE estimation. The PCRF 901 collects the flow information from the AF or a transborder data flow (TDF) according to service providers, and makes a request to the QoE estimation unit 907 for measuring the current QoE level for the corresponding video flow.

The PCRF 901 registers specific metrics necessary for the QoE estimation, based on the flow information and the QoE estimation model. The PCRF 901 negotiates with the UE measurement unit 903 and the network measurement unit 905 to thereby receive available metrics from the UE measurement unit 903 and the network measurement unit 905. When the PCRF has determined that the QoE metric report is to be periodically received, the PCRF 901 periodically receives the QoE metrics in a predetermined period.

When the requested QoE metrics are received, the PCRF 901 provides the received QoE metrics to the QoE estimation unit 907. If the requested QoE metrics are not available, the PCRF 901 reports an error message to the QoE estimation unit 907. The error message includes information on the unavailable QoE metrics, which may be used for the additional operation related to the QoE.

The subscriber report model set forth above minimizes QoE-related metric report overhead.

The QoE estimation unit 907 estimates the current QoE using the received information, and transmits the estimation result to the PCRF 901. According to the QoE estimation result, if the QoE adjustment is required, the PCRF 901 performs a QoE enforcement mechanism according to the video type. The QoE enforcement mechanism may be one of AF-based QoE adjustment, dynamic QoS adjustment, or packet level treatment for the QoE.

Figure 10A:
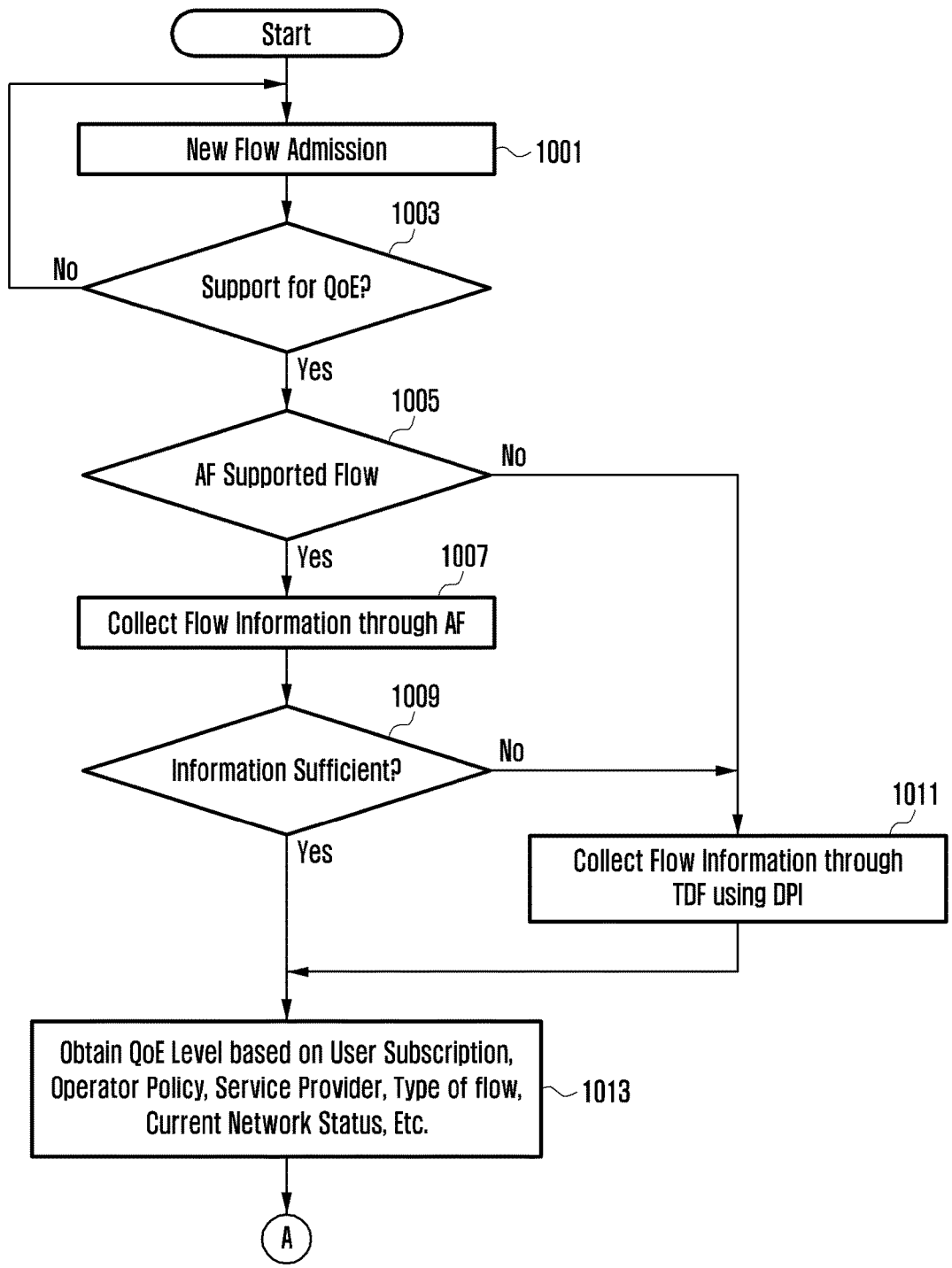
FIGS. 10A and 10B are flowcharts illustrating a method for collecting flow information by the PCRF according to the present invention.
Figure 10B:
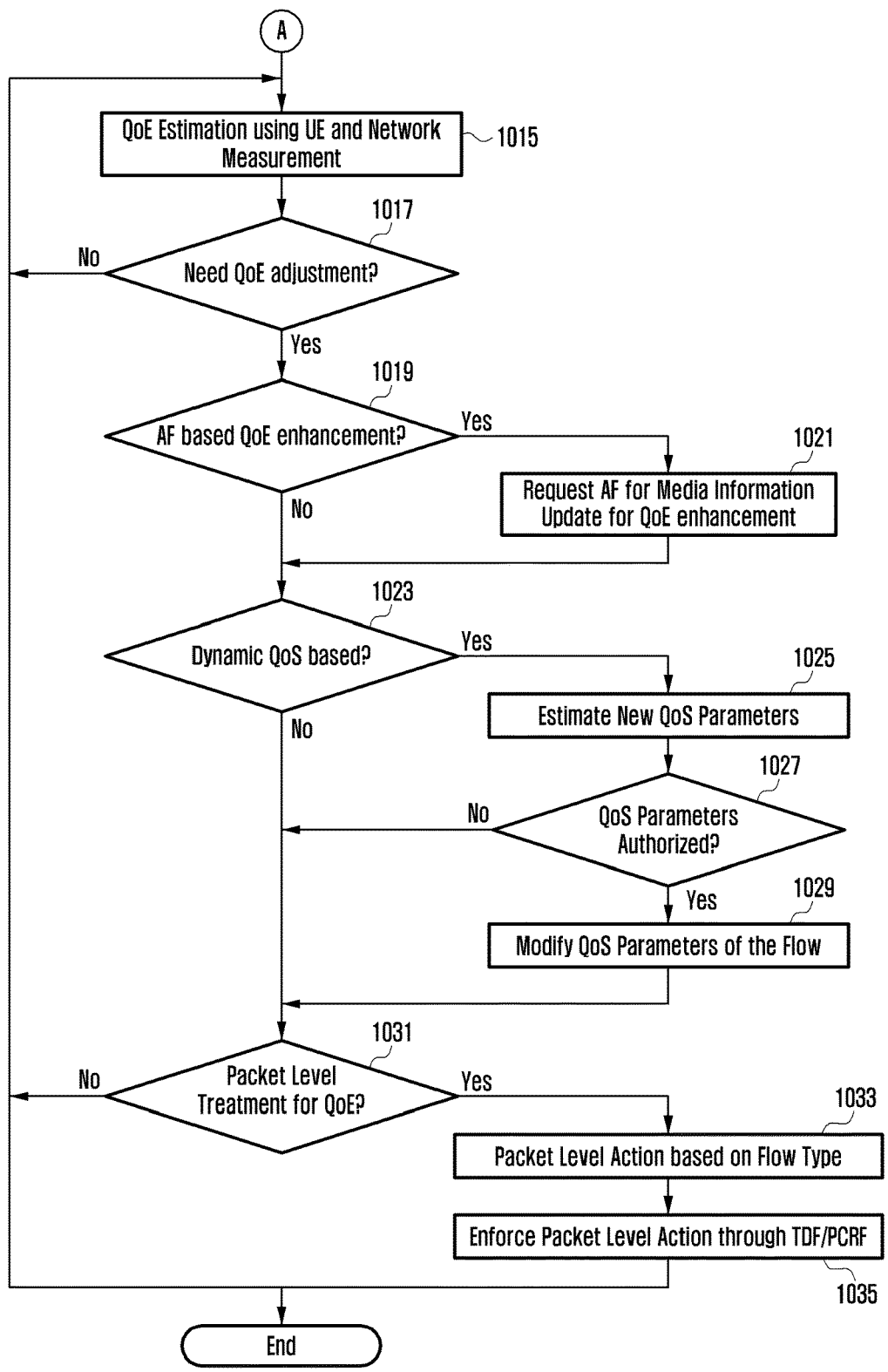

FIGS. 10A and 10B are flowcharts illustrating a method for collecting flow information by the PCRF according to the present invention.

Referring to FIG. 10A, the PCRF allows a new video flow transmission in step 1001, such as according to a UE request.

The PCRF determines whether the QoE is supported with respect to the corresponding flow in step 1003.

The PCRF determines whether the AF provides the corresponding flow and supports the QoE according to an instruction of the PCRF in step 1005.

If the AF provides the corresponding flow, the PCRF collects the flow information through the AF in step 1007. At this time, the PCRF performs data communication with the AF through the Rx interface defined in the present invention to thereby receive the flow information, as will be described in detail below with reference to FIG. 11.

The PCRF determines whether the flow information collected from the AF is sufficient in step 1009. The PCRF may determine that the flow information collected from the AF is sufficient if a number of QoE related parameters included in the flow information is equal to or greater than a predetermined number.

If the collected flow information is not sufficient, or if the AF does not provide the corresponding flow, the PCRF collects the flow information using deep packet inspection (DPI) through the TDF in step 1011. The PCRF performs data communication with the TDF through the secure digital (Sd) interface defined in the present invention and described in detail below with reference to FIG. 12, to thereby receive the flow information.

The PCRF obtains a QoE level, based on parameters such as user subscription information, a policy of the operator, a service provider, the type of flow, and the current network status in step 1013.

In FIG. 10B, the PCRF performs the QoE estimation through the UE measurement unit and the network measurement unit in step 1015. The PCRF makes a request to the UE measurement unit and the network measurement unit for the QoE metrics, and transmits the received QoE metrics and flow information to the QoE estimation unit to thereby estimate QoE for the current flow. The PCRF identifies the QoE, based on the QoE estimation result received from the QoE estimation unit.

The PCRF determines whether the QoE adjustment is required according to the QoE estimation result in step 1017. If the QoE adjustment is required due to a difference between the current QoE and the required QoE, the PCRF performs the QoE adjustment, based on the QoE enforcement mechanism.

If the QoE enforcement mechanism is the AF-based adjustment in step 1019, the PCRF makes a request to the AF for renewing media information for improvement of the QoE in step 1021. The PCRF requests of the AF to lower the data transmission rate.

If the QoE enforcement mechanism is the dynamic QoS adjustment in step 1023, the PCRF performs a QoS modification operation. The PCRF estimates a new QoS parameter in step 1025, determines whether the estimated QoS parameter is the one that has been authorized with respect to the corresponding flow in step 1027. If the new estimated QoS parameter has been authorized, the PCRF modifies the QoS parameter of the flow as the new estimated QoS parameter in step 1029. If the new estimated QoS parameter has not been authorized, the PCRF may attempt to adjust the QoE by another enforcement mechanism without modifying the QoS, or may abandon the QoE adjustment.

If the QoE enforcement mechanism is the packet level treatment for the QoE in step 1031, the PCRF adjusts the QoE by decreasing the amount of packets, based on the type of flow in step 1033. The PCRF may inspect the packet for a QoE control of the packet level treatment, and may define the type of packet level for each flow, based on the type of traffic and supported codec information. The packet treatment rule may be created by the PCRF, and may be provided to the TDF/PCRF. The PCRF enforces a packet level action through the TDF/PCRF to thereby attain the required QoE in step 1035.

Figure 11:
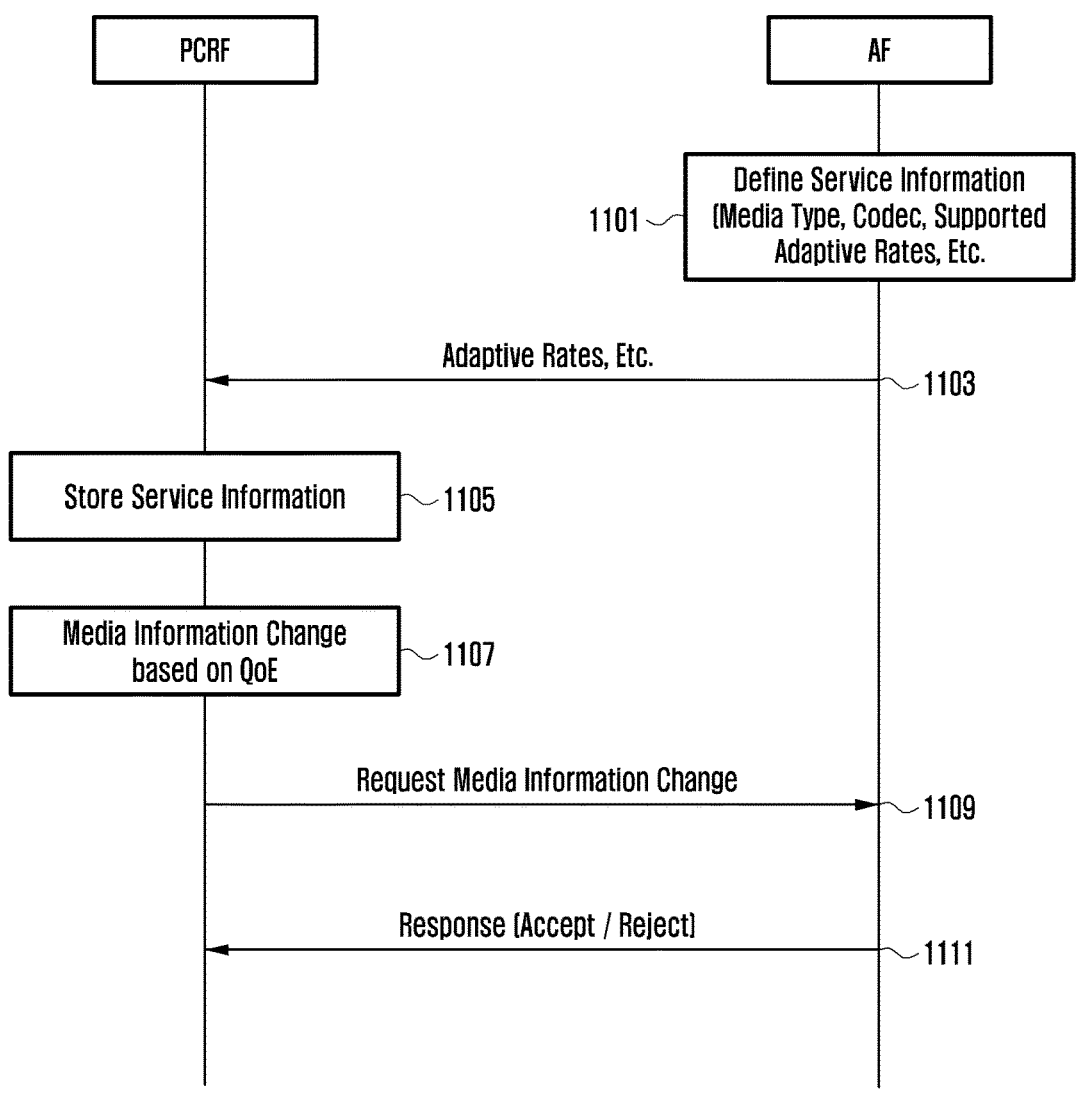
FIG. 11 is a flowchart illustrating a method for transmitting and receiving data through an Rx interface according to the present invention.

FIG. 11 is a flowchart illustrating a method for transmitting and receiving data through the Rx interface, according to the present invention.

The Rx interface is used for communication between the PCRF and the AF. The AF provides media information including supported codecs, or supported transmission rates to the PCRF through the Rx interface, and the PCRF transmits a request for changing the media information to the AF through the Rx interface. The AF transmits an acceptance/rejection message in response to the change request through the Rx interface.

If the flow is provided by the AF, and if QoE improvement is possible by the instruction of the PCRF, the PCRF and the AF transmit and receive the data as previously disclosed through the Rx interface.

In FIG. 11, the AF defines service information in step 1101. The AF transmits the defined service information to the PCRF in step 1103. The PCRF stores the received service information in step 1105.

The media information is improved in order to provide a more detailed version of the flow information including a supported video transmission rate. When the PCRF recognizes that the media information is to be changed based on the QoE according to QoE provisioning disclosed in the present invention in step 1107, the PCRF makes a request to the AF for changing the media information, based on QoE provisioning in step 1109.

The AF that has received the media information change request determines whether to accept or reject the request, and transmits an acceptance/rejection response to the PCRF in step 1111. If the AF can support the QoE, the AF accepts the request, and changes the media information according thereto. If the AF cannot support the QoE, the AF rejects the request to allow the PCRF to utilize another mechanism for QoE provisioning.

Figure 12:
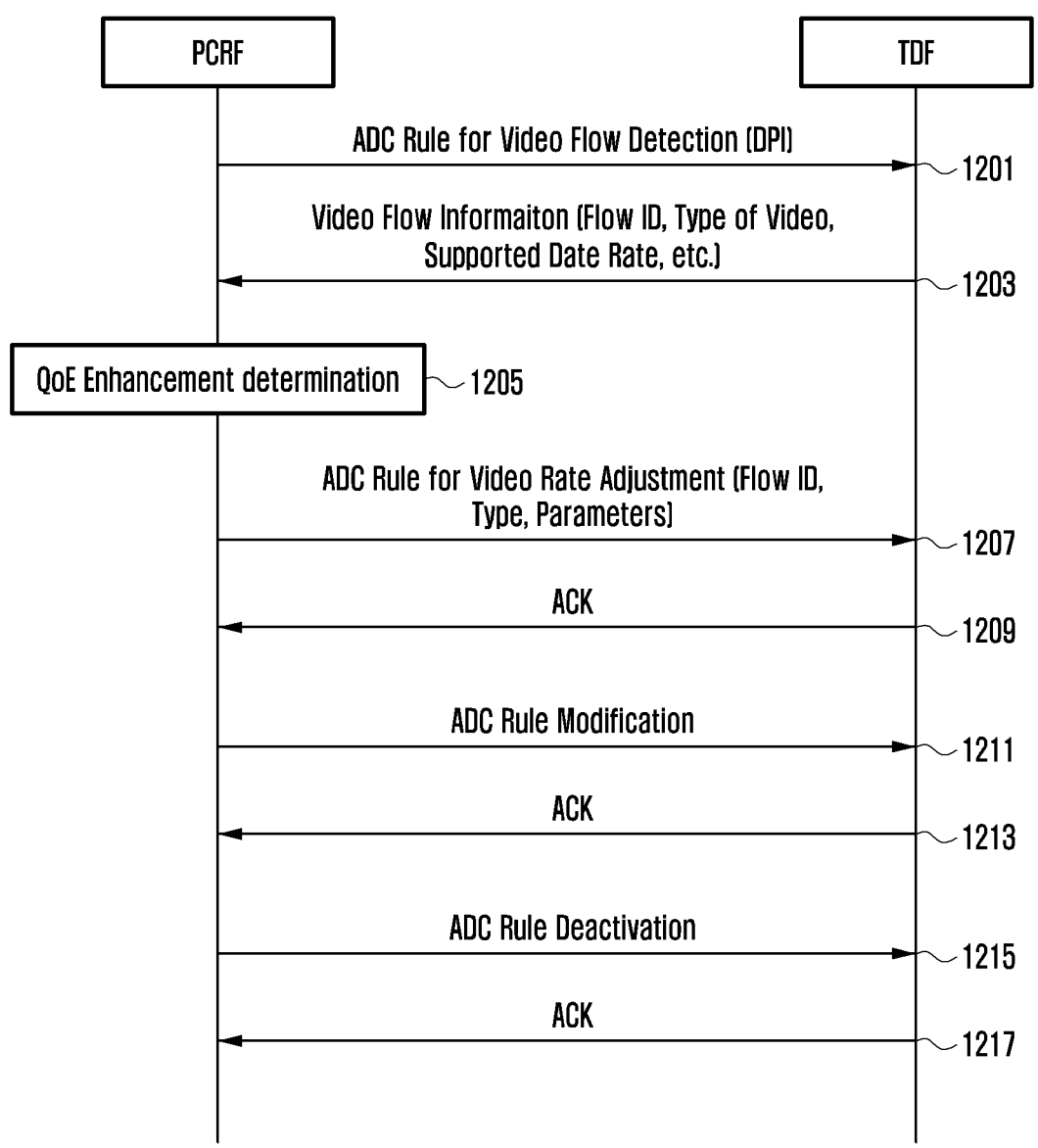
FIG. 12 is a flowchart illustrating a method for transmitting and receiving data through an Sd interface according to the present invention.

FIG. 12 is a flowchart illustrating a method for transmitting and receiving data through the Sd interface, according to the present invention.

The Sd interface is used for providing an application detection control (ADC) rule created by the PCRF. The ADC rule is for detecting the flow information, e.g., a flow ID, the video type, and a supported data rate. The ADC rule for QoE provisioning is for adjusting a video transmission rate, depending on the video flow type as well as the rule for admitting a transmission rate for the DASH and a progressive download. The ADC rule may block a specific layer of scalable video coding for the RTP/RSTP based on video streaming.

In QoE provisioning, the Sd interface may be used for identifying the video flow and collecting the video flow information, as well as providing the ADC rule for the packet level treatment mechanism to the TDF in order to improve the QoE.

When the PCRF has determined that QoE provisioning is to be used, the PCRF makes a request to the TDF for detecting the video flow information using the DPI in step 1201. The TDF detects each video flow, and reports flow-related parameters, such as a flow ID, the video type flow, or a supported data transmission rate, to the PCRF in step 1203.

When the QoE adjustment is required and the enforcement of QoE is determined in step 1205, the PCRF provides the ADC rule, such as parameters (e.g., a flow ID and the type of flow) related to a specific video flow to the TDF for the packet level treatment in step 1207. The TDF transmits an acknowledgement (ACK) response to the received ADC rule in step 1209.

According to the determination of the PCRF on QoE provisioning, the PCRF provides a mechanism for ADC rule modification in step 1211 and the ADC rule deactivation in step 1215 to the TDF, which transmits an ACK response to each mechanism in steps 1213 and 1217.

Figure 13:
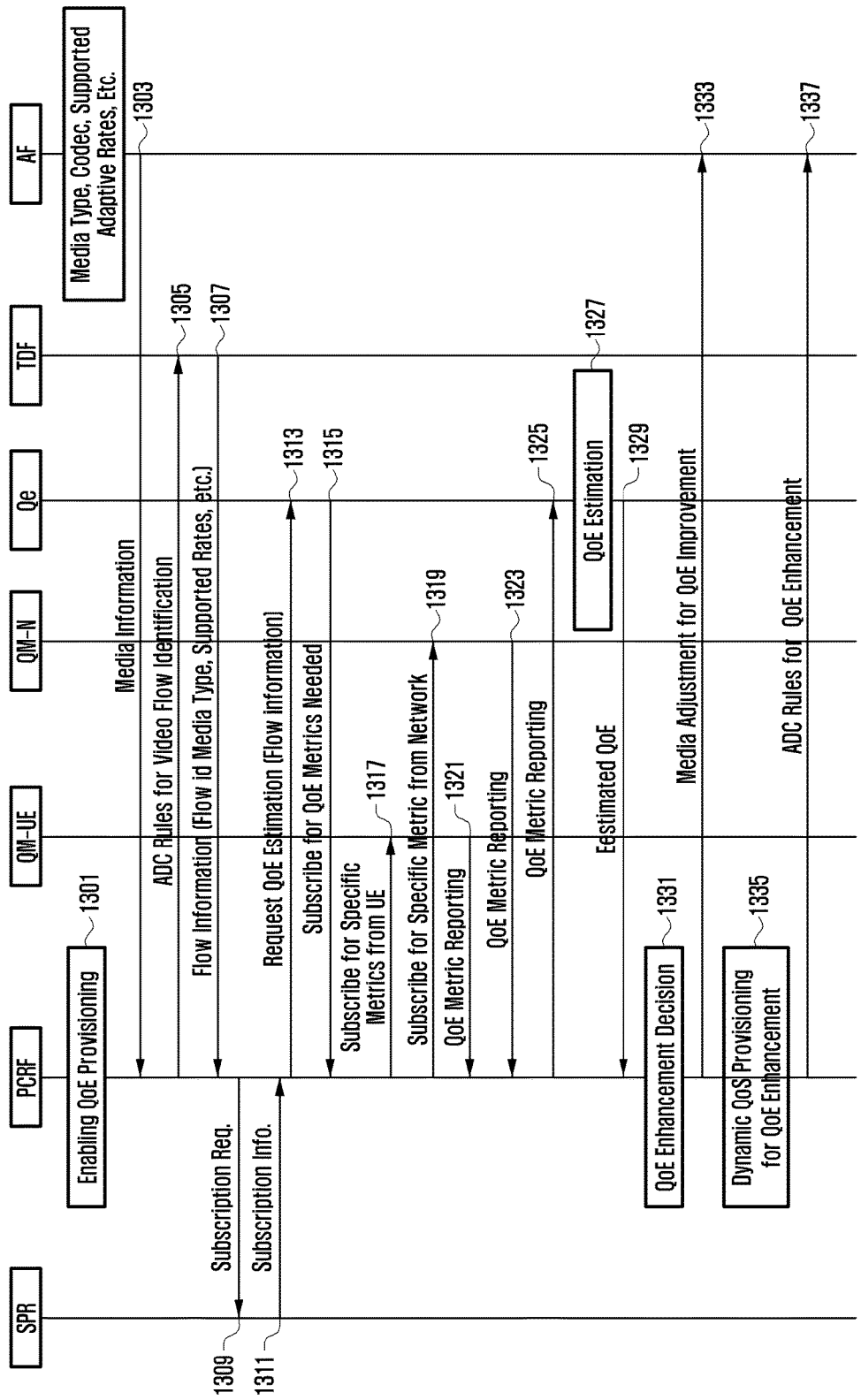
FIG. 13 is a flowchart illustrating a QoE provisioning method of the PCRF according to the present invention.

FIG. 13 is a flowchart illustrating QoE provisioning method of the PCRF according to the present invention.

Referring to FIG. 13, when the PCRF enables QoE provisioning in step 1301, the PCRF collects the media information on the flow supporting QoE provisioning from the AF and/or the TDF in step 1303. Collecting the flow information from the TDF includes transmitting, by the PCRF, the ADC rule for identifying the video flow to the TDF in step 1305, and receiving, by the PCRF, the flow information from the TDF in step 1307, as set forth in FIG. 12.

If necessary, the PCRF makes a request to a subscription profile repository (SPR) for the subscriber information in step 1309, and receives the subscriber information from the SPR in step 1311.

The necessary metrics in relation to the required QoE are determined by the QoE estimation unit. The PCRF transmits the QoE estimation request together with the flow information to the QoE estimation unit in step 13133. The QoE estimation unit reports the QoE metrics necessary for the QoE estimation to the PCRF, based on the flow information in step 1315.

The PCRF makes a request to the UE measurement unit and the network measurement unit for the necessary metrics in steps 1317 and 1319, and receives a report of the collected QoE metrics from the UE measurement unit and the network measurement unit in steps 1321 and 1323. The PCRF provides the reported QoE metrics to the QoE estimation unit in step 1325. The QoE estimation unit estimates the current QoE for the corresponding video flow, based on the QoE metrics and the flow information in step 1327, and reports the estimated QoE to the PCRF in step 1329.

If the current level of the QoE is not sufficient for the required QoE, the PCRF determines the improvement of the QoE in step 1331, and makes a request to the AF for the media adjustment for the QoE improvement in step 1333.

The PCRF performs the QoE improvement using the QoE enforcement mechanism determined according to the video type flow in step 1335).

FIG. 13 illustrates an example in which the PCRF adjusts the QoE according to the dynamic QoS adjustment mechanism. When the PCRF obtains the flow information through the TDF, the PCRF transmits the ADC rule for QoE improvement to the TDF in step 1337.

Figure 14:
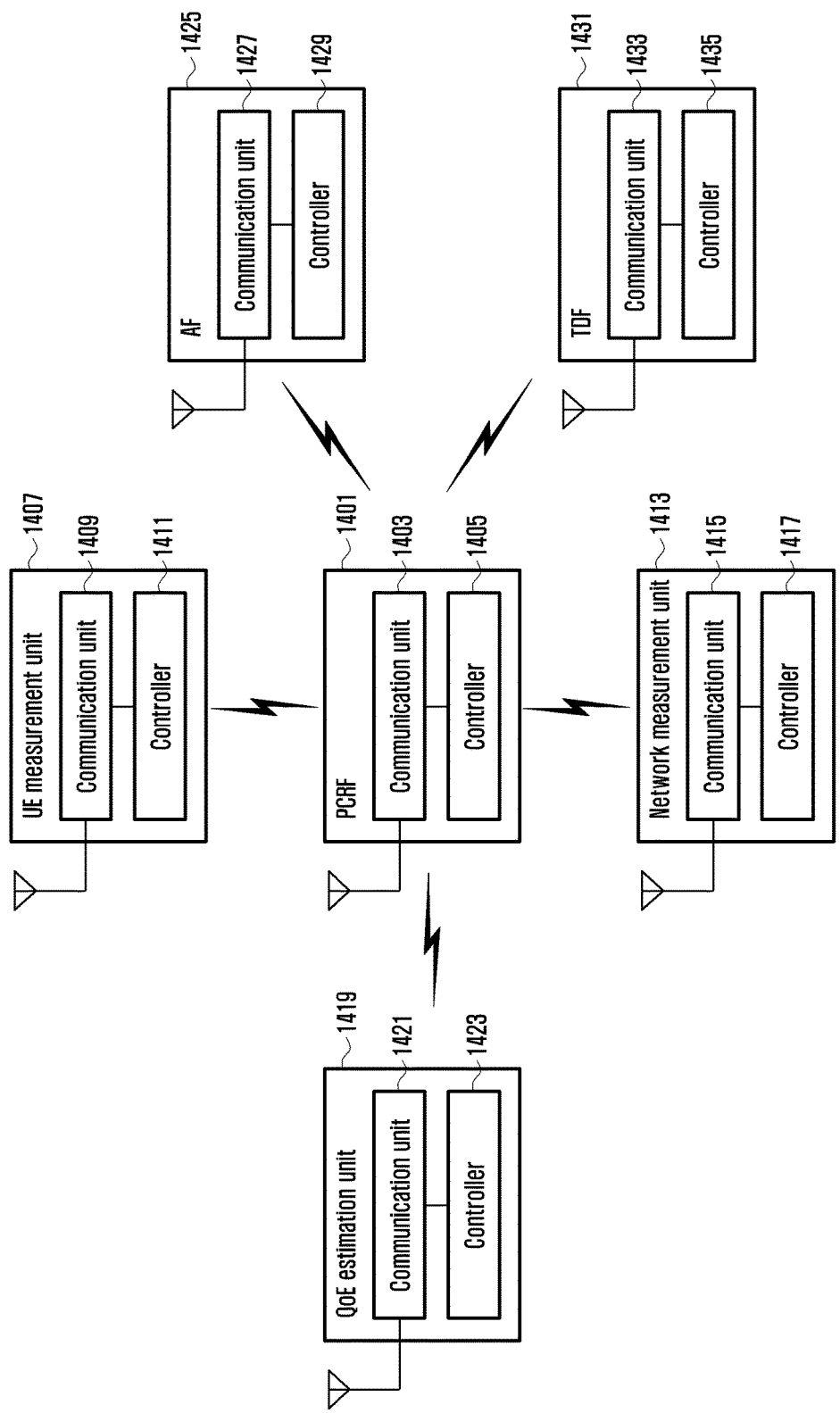
FIG. 14 illustrates block diagrams of apparatuses for performing QoE provisioning according to the present invention.

FIG. 14 is a block diagram of apparatuses for performing QoE provisioning according to the present invention.

Referring to FIG. 14, the apparatuses include the PCRF 1401, the UE measurement unit 1407, the network measurement unit 1413, the QoE estimation unit 1419, the AF 1425, and the TDF 1431.

The PCRF 1401 includes a communication unit 1403 and a controller 1405. The communication unit 1403 performs data communication under control of the controller 1405, which as described above in detail, controls elements of the PCRF 1401 including the communication unit 1403 for performing QoE provisioning according to the present invention.

The UE measurement unit 1407 includes a communication unit 1409 and a controller 1411. The communication unit 1409 performs data communication under control of the controller 1411, which as described above in detail, controls elements of the UE measurement unit 1407 including the communication unit 1409 for performing the UE measurement for QoE provisioning according to the present invention. The UE measurement unit 1407 includes software-based elements or hardware-based elements as described in FIG. 6. In the software-based elements shown in FIG. 6, the operation of the elements may be performed by software executed by the controller 1411. Alternatively, the elements shown in FIG. 6 may be understood to perform the same functions as the controller 1411, or may be the same as the controller 1411.

The network measurement unit 1413 includes a communication unit 1415 and a controller 1417. The communication unit 1415 performs data communication under control of the controller 1417, which controls elements of the network measurement unit 1413 including the communication unit 1415 for performing the network measurement for QoE provisioning according to the present invention.

The QoE estimation unit 1419 includes a communication unit 1421 and a controller 1423. The communication unit 1421 performs data communication under control of the controller 1423, which as described above in detail, controls elements of the QoE estimation unit 1419 including the communication unit 1421 for performing the QoE estimation for QoE provisioning according to the present invention.

The AF 1425 includes a communication unit 1427 and a controller 1429. The communication unit 1427 performs data communication under control of the controller 1429, which as described above in detail, controls elements of the AF 1425 including the communication unit 1427 for performing the operation for QoE provisioning by the control (request) of the PCRF 1401 according to the present invention.

The TDF 1431 includes a communication unit 1433 and a controller 1435. The communication unit 1433 performs data communication under control of the controller 1435, which as described above in detail, controls elements of the TDF 1431 including the communication unit 1433 for performing the operation for QoE provisioning by the control (request) of the PCRF 1401 according to the present invention.

Those skilled in the art can appreciate that it is possible to implement the present invention in other specific forms without changing the technical idea or the indispensable characteristics of the present invention. Accordingly, it should be understood that the embodiments described above are examples and are not limited.

Although embodiments of the present invention have been shown and described in this specification and the drawings, they are used in a general sense in order to easily explain technical contents of the present invention, and to assist in the comprehension of the present invention, and are not intended to limit the scope of the present invention. It is obvious to those skilled in the art to which the present invention pertains that other modified embodiments can be derived on the basis of the spirit of the present invention besides the embodiments disclosed herein.

What is claimed is:

1. A quality of experience (QoE) provisioning method of a policy and charging rules function (PCRF) in a network, the method comprising:
   receiving, by the PCRF, user equipment (UE) related information from a UE measurement apparatus and network related information from a network measurement apparatus in the network, for QoE estimation of a data flow;
   transmitting, by the PCRF, a request for the QoE estimation for the data flow to a QoE estimation unit in the network, the request including the UE related information and the network related information used for the QoE estimation;
   receiving, by the PCRF, a QoE estimated by the QoE estimation unit from the QoE estimation unit;
   identifying, by the PCRF, a QoE adjustment mechanism based on a type of the data flow;
   transmitting, by the PCRF, a request for a first QoE adjustment to an application function (AF), if information on the data flow is transmitted from the AF, based on the QoE estimated by the QoE estimation unit and a QoE required for the data flow, the first QoE adjustment being performed by decreasing a transmission rate of the data flow; and
   transmitting, by the PCRF, a request for a second QoE adjustment to a transborder data flow (TDF) if information on the data flow is collected based on the TDF by using deep packet inspection in the case that the information on the data flow transmitted from the AF is insufficient, the request including a parameter related to the data flow for the second QoE adjustment, the second QoE adjustment being performed by dropping at least one of data packets of the data flow,
   wherein transmitting the request for the first QoE adjustment comprises:
   receiving information including a transmission rate supported by the AF,
   transmitting the request for the first QoE adjustment to the AF, and
   receiving the data flow with a decreased transmission rate from the AF.

2. The method of claim 1, wherein receiving the UE related information and the network related information for QoE estimation comprises:
   receiving information for the QoE estimation from the QoE estimation unit;
   requesting the UE related information to the UE measurement apparatus and requesting the network related information to the network measurement apparatus; and
   receiving the UE related information from the UE measurement apparatus, and receiving the network related information from the network measurement apparatus.

3. The method of claim 2, wherein the UE related information includes at least one of application parameters including buffering delay, an available buffer, or user activities, feedback parameters about user viewing experience after viewing a video, and network parameters including at least one of a current time, a geographical position, a cell identifier (ID), received signal strength indication (RSSI), an end-to-end delay, a loss rate, or bandwidth, and the network related information includes information on the quality of service (QoS).

4. The method of claim 1, wherein identifying the QoE adjustment mechanism comprises identifying one of QoE enforcement mechanisms including a server-based QoE adjustment, a dynamic QoS adjustment, and packet level treatment, based on the type of the data flow.

5. The method of claim 1, wherein the request for the first QoE adjustment is transmitted through a receiver (Rx) interface between the PCRF and the AF.

6. A quality of experience (QoE) provisioning method of a user equipment (UE) measurement apparatus in a network, the method comprising:
   receiving, by the UE, a request for UE related information for QoE estimation from a policy and charging rules function (PCRF);
   collecting, by the UE, the UE related information; and
   transmitting, by the UE, the collected information to the PCRF,
   wherein the UE related information is used in combination with network related information obtained from a network measurement apparatus to estimate a QoE of a data flow,
   wherein the estimated QoE is used for a QoE adjustment,
   wherein a QoE adjustment mechanism is identified based on a type of the data flow,
   wherein a request for a first QoE adjustment is transmitted to an application function (AF), if information on the data flow is transmitted from the AF, the first QoE adjustment being performed by decreasing a transmission rate of the data flow,
   wherein the request for a second QoE adjustment is transmitted to a transborder data flow (TDF), if information on the data flow is supported by the TDF, the request including a parameter related to the data flow for the second QoE adjustment, the second QoE adjustment being performed by dropping at least one of data packets of the data flow,
   wherein the information on the data flow supported by the TDF is collected by using deep packet inspection, in the case that the information on the data flow transmitted from the AF is insufficient, and
   wherein information including a transmission supported by the AF is transmitted from the AF to the PCRF, the request for the first QoE adjustment is transmitted to the AF, and the data flow with a decreased transmission rate is transmitted from the AF to the PCRF.

7. The method of claim 6, wherein the UE related information includes at least one of application parameters including a buffering delay, an available buffer, or user activities, feedback parameters about a user viewing experience after viewing a video, and at least one of network parameters including a current time, a geographical position, a cell identifier (ID), received signal strength indication (RSSI), an end-to-end delay, a loss rate, and bandwidth.

8. The method of claim 6,
wherein the UE related information is used for the PCRF to instruct a QoE estimation unit in the network to estimate the QoE for the data flow.

9. A quality of experience (QoE) provisioning method of a network measurement apparatus in a network, the method comprising:
receiving, by the network measurement apparatus, a request for network related information for QoE estimation from a policy and charging rules function (PCRF);
collecting, by the network measurement apparatus, the network related information; and
transmitting, by the network measurement apparatus, the collected information to the PCRF,
wherein the network related information is used in combination with user equipment (UE) related information obtained from a UE measurement apparatus to estimate a QoE of a data flow,
wherein the estimated QoE is used for a QoE adjustment,
wherein a QoE adjustment mechanism is identified based on a type of the data flow,
wherein a request for a first QoE adjustment is transmitted to an application function (AF), if information on the data flow is transmitted from the AF, the first QoE adjustment being performed by decreasing a transmission rate of the data flow,
wherein a request for a second QoE adjustment is transmitted to a transborder data flow (TDF), if information on the data flow is supported by the TDF, the request including a parameter related to the data flow for the second QoE adjustment, the second QoE adjustment being performed by dropping at least one of data packets of the data flow,
wherein the information on the data flow supported by the TDF is collected by using deep packet inspection, in the case that the information on the data flow transmitted from the AF is insufficient, and
wherein information including a transmission supported by the AF is transmitted from the AF to the PCRF, the request for the first QoE adjustment is transmitted to the AF, and the data flow with a decreased transmission rate is transmitted from the AF to the PCRF.

10. The method of claim 9,
wherein the network related information includes information on a quality of service (QoS).

11. The method of claim 9, wherein the network related information is used for the PCRF to instruct a QoE estimation unit in the network to estimate the QoE for the data flow.

12. A policy and charging rules function (PCRF) for performing quality of experience (QoE) provisioning in a network, the PCRF comprising:
a transceiver; and
at least one processor configured to:
receive user equipment (UE) related information from a UE measurement apparatus and network related information from a network measurement apparatus in the network for QoE estimation of a data flow,
transmit a request for the QoE estimation for the data flow to a QoE estimation unit in the network, the request including the UE related information and the network related information used for the QoE estimation,
receive a QoE estimated by the QoE estimation unit from the QoE estimation unit,
identify a QoE adjustment mechanism based on a type of the data flow,
transmit a request for a first QoE adjustment to an application function (AF), if information on the data flow is transmitted from the AF, based on the QoE estimated by the QoE estimation unit and a QoE required for the data flow, the first QoE adjustment being performed by decreasing a transmission rate of the data flow, and
transmit a request for a second QoE adjustment to a transborder data flow (TDF), if information on the data flow is collected based on the TDF by using deep packet inspection in the case that the information on the data flow transmitted from the AF is insufficient, the request including a parameter related to the data flow for the second QoE adjustment, the second QoE adjustment being performed by dropping at least one of data packets of the data flow,
wherein the at least one processor is configured to:
receive information including a transmission rate supported by the AF,
transmit the request for the first QoE adjustment to the AF, and
receive the data flow with a decreased transmission rate from the AF.

13. The PCRF of claim 12, wherein the at least one processor is further configured to:
receive information for the QoE estimation from the QoE estimation unit,
request the UE related information to the UE measurement apparatus and the network related information to the network measurement apparatus, and
receive the UE related information from the UE measurement apparatus, and receive the network related information from the network measurement apparatus.

14. The PCRF of claim 13, wherein the UE related information includes at least one of application parameters including a buffering delay, an available buffer, or user activities, feedback parameters about a user viewing experience after viewing a video, and at least one of network parameters including a current time, a geographical position, a cell identifier (ID), received signal strength indication (RSSI), an end-to-end delay, a loss rate, a bandwidth, and the network related information includes information on a quality of service (QoS).

15. The PCRF of claim 12,
wherein the request for the first QoE adjustment is transmitted through a receiver (Rx) interface between the PCRF and the AF.

16. A user equipment (UE) measurement apparatus for performing quality of experience (QoE) provisioning in a network, the UE measurement apparatus comprising:
a transceiver; and
at least one processor configured to:
receive a request for UE related information for QoE estimation from a policy and charging rules function (PCRF),
collect the UE related information, and
transmit the collected information to the PCRF,
wherein the UE related information is used in combination with network related information obtained from a network measurement apparatus to estimate a QoE of a data flow,
wherein the estimated QoE is used for a QoE adjustment, wherein a QoE adjustment mechanism is identified based on a type of the data flow, wherein a request for a first QoE adjustment is transmitted to an application function (AF), if information on the data flow is transmitted from the AF, the first QoE adjustment being performed by decreasing a transmission rate of the data flow, wherein a request for a second QoE adjustment is transmitted to a transborder data flow (TDF), if information on the data flow is supported by the TDF, the request including a parameter related to the data flow for the second QoE adjustment, the second QoE adjustment being performed by dropping at least one of data packets of the data flow, wherein the information on the data flow supported by the TDF is collected by using deep packet inspection, in the case that the information on the data flow transmitted from the AF is insufficient, and wherein information including a transmission supported by the AF is transmitted from the AF to the PCRF, the request for the first QoE adjustment is transmitted to the AF, and the data flow with a decreased transmission rate is transmitted from the AF to the PCRF.

17. The UE measurement apparatus of claim 16, wherein the UE related information includes at least one of application parameters including a buffering delay, an available buffer, or user activities, feedback parameters about a user viewing experience after viewing a video, and at least one of network parameters including a current time, a geographical position, a cell identifier (ID), received signal strength indication (RSSI), an end-to-end delay, a loss rate, and bandwidth.

18. The UE measurement apparatus of claim 16, wherein the UE related information is used for the PCRF to instruct a QoE estimation unit in the network to estimate the QoE for the data flow.

19. A network measurement apparatus for performing quality of experience (QoE) provisioning in a network, the network measurement apparatus comprising:
a transceiver; and
at least one processor configured to:
receive a request for network related information for QoE estimation from a policy and charging rules function (PCRF),
collect the network related information, and
transmit the collected information to the PCRF,
wherein the network related information is used in combination with user equipment (UE) related information obtained from a UE measurement apparatus to estimate a QoE of a data flow,
wherein the estimated QoE is used for a QoE adjustment,
wherein a QoE adjustment mechanism is identified based on a type of the data flow,
wherein a request for a first QoE adjustment is transmitted to an application function (AF), if information on the data flow is transmitted from the AF, the first QoE adjustment being performed by decreasing a transmission rate of the data flow, and wherein a request for a second QoE adjustment is transmitted to a transborder data flow (TDF), if information on the data flow is supported by the TDF, the request including a parameter related to the data flow for the second QoE adjustment, the second QoE adjustment being performed by dropping at least one of data packets of the data flow, wherein the information on the data flow supported by the TDF is collected by using deep packet inspection, in the case that the information on the data flow transmitted from the AF is insufficient, and wherein information including a transmission supported by the AF is transmitted from the AF to the PCRF, the request for the first QoE adjustment is transmitted to the AF, and the data flow with a decreased transmission rate is transmitted from the AF to the PCRF.

20. The network measurement apparatus of claim 19, wherein the network related information includes information on a quality of service (QoS).

21. The method of claim 1, wherein transmitting the request for the first QoE adjustment further comprises:
determining whether a difference between a level of the QoE estimated by the QoE estimation unit and a level of a current QoE is greater than a predetermined level; and
transmitting, if the difference is greater than the predetermined level, the request for first QoE adjustment to the AF.

22. The method of claim 6, wherein the request for the first QoE adjustment is transmitted to the AF based on the estimated QoE, if a difference between a level of the estimated QoE and a level of a current QoE is greater than a predetermined level.

23. The method of claim 9, wherein the request for the first QoE adjustment is transmitted to the AF based on the estimated QoE, if a difference between a level of the estimated QoE and a level of a current QoE is greater than a predetermined level.

24. The PCRF of claim 12, wherein the at least one processor is further configured to determine a difference between a level of the QoE estimated by the QoS estimation unit and a level of a current QoE is greater than a predetermined level, and transmits, if the difference is greater than the predetermined level, the request for first QoE adjustment to the AF.

25. The UE measurement apparatus of claim 16, wherein the request for the first QoE adjustment is transmitted to the AF based on the estimated QoE, if a difference between a level of the estimated QoE and a level of a current QoE is greater than a predetermined level.

26. The network measurement apparatus of claim 19, wherein the request for the first QoE adjustment is transmitted to the AF based on the estimated QoE, if a difference between a level of the estimated QoE and a level of a current QoE is greater than a predetermined level.

* * * * *